US012813015B2

(12) United States Patent
Tchoulfian et al.

(10) Patent No.: US 12,813,015 B2
(45) Date of Patent: Nov. 24, 2026

(54) OPTOELECTRONIC DEVICE AND METHOD FOR MANUFACTURING SAME

(71) Applicant: ALEDIA, Echirolles (FR)

(72) Inventors: Pierre Tchoulfian, Grenoble (FR); Benoît Amstatt, Grenoble (FR); Timothée Lassiaz, Grenoble (FR); Yoann Malier, Saint Egreve (FR)

(73) Assignee: ALEDIA, Echirolles (FR)

( * ) Notice: Subject to any disclaimer, the term of this patent is extended or adjusted under 35 U.S.C. 154(b) by 438 days.

(21) Appl. No.: 18/564,265

(22) PCT Filed: May 19, 2022

(86) PCT No.: PCT/EP2022/063551
§ 371 (c)(1),
(2) Date: Nov. 27, 2023

(87) PCT Pub. No.: WO2022/248326
PCT Pub. Date: Dec. 1, 2022

(65) Prior Publication Data

US 2024/0250206 A1 Jul. 25, 2024

(30) Foreign Application Priority Data

May 27, 2021 (FR) ....................................... 2105542

(51) Int. Cl.
*H10H 20/81* (2025.01)
*H10H 20/01* (2025.01)
(Continued)

(52) U.S. Cl.
CPC .. *H10H 20/8215* (2025.01); *H10H 20/01335* (2025.01); *H10H 20/816* (2025.01); *H10H 20/821* (2025.01); *H10H 20/825* (2025.01)

(58) Field of Classification Search
CPC ............. H10H 20/8215; H10H 20/821; H10H 20/825; H10H 20/01335; H10H 20/816
See application file for complete search history.

(56) References Cited

U.S. PATENT DOCUMENTS

| | | | | |
|---|---|---|---|---|
| 5,700,713 A | | 12/1997 | Yamazaki et al. | |
| 6,060,335 A | * | 5/2000 | Rennie | B82Y 20/00 148/DIG. 95 |

(Continued)

FOREIGN PATENT DOCUMENTS

| | | |
|---|---|---|
| CN | 109285774 A | 1/2019 |
| EP | 3206237 A1 | 8/2017 |

(Continued)

OTHER PUBLICATIONS ip.com search history (Year: 2026).*

(Continued)

*Primary Examiner* — Zandra V Smith
*Assistant Examiner* — Andre C Stevenson
(74) *Attorney, Agent, or Firm* — HAUPTMAN HAM, LLP

(57) ABSTRACT

As described, a GaN-based light-emitting diode includes a n-GaN based electron injection region, a p-GaN based hole injection region, an active region located between the electron injection region and the hole injection region, configured to emit a light radiation, a hydrogen blocking layer, the light-emitting diode being wherein the hole injection region includes at least one activated portion and at least one inactivated portion such that the activated portion has an acceptor concentration at least ten times greater than an acceptor concentration of the inactivated portion, and in that the at least one inactivated portion is interposed between the electron injection region and the hydrogen blocking layer, so that the hydrogen blocking layer prevents a release of (Continued)

hydrogen from the inactivated portion. Also described is a method for manufacturing such an LED.

22 Claims, 5 Drawing Sheets

(51) Int. Cl.

| | |
|---|---|
| ***H10H 20/816*** | (2025.01) |
| ***H10H 20/821*** | (2025.01) |
| ***H10H 20/825*** | (2025.01) |

(56) References Cited

U.S. PATENT DOCUMENTS

| | | | | |
|---|---|---|---|---|
| 2015/0340551 | A1* | 11/2015 | Mei | H01S 5/0421 257/13 |
| 2017/0200865 | A1* | 7/2017 | Brummer | H10H 20/812 |
| 2018/0277715 | A1* | 9/2018 | Ma | H10H 20/811 |

FOREIGN PATENT DOCUMENTS

| | | | |
|---|---|---|---|
| KR | 10-2021-0030930 | A | 3/2021 |
| WO | 2017200845 | A1 | 11/2017 |
| WO | 2020232385 | A1 | 11/2020 |
| WO | 2021069288 | A1 | 4/2021 |

OTHER PUBLICATIONS

Espacenet search history. (Year: 2026).*

Korean Notification issued in corresponding Korean Application No. 10-2023-7044151, dated Oct. 29, 2025, pp. 1-14.

Lin et al., Ray-Ming, "Improving the Luminescence of InGaN-GaN Blue LEDs Through Selective Ring-Region Activation of the Mg-Doped GaN Layer," IEEE Photonics Technology Letters, vol. 19, No. 12, Jun. 15, 2007, pp. 928-930.

Pietak et al., Karolina, "Phosphorus implantation of Mg-doped (Al)GaN heterostructures: structural examination and depth profiling" J. of Materials Science: Materials in Electronics, vol. 31, No. 20, Sep. 17, 2020, pp. 17892-17902.

International Search Report issued in corresponding International Application No. PCT/EP2022/063551, dated Sep. 16, 2022, European Patent Office, Rijswijk, Netherlands.

Written Opinion issued in corresponding International Application No. PCT/EP2022/063551, dated Sep. 16, 2022, European Patent Office, Rijswijk, Netherlands.

* cited by examiner

OPTOELECTRONIC DEVICE AND METHOD FOR MANUFACTURING SAME

The present application is a U.S. National Phase of International Application Number PCT/EP2022/063551, filed May 19, 2022, which claims priority to French Application No. 2105542, filed May 27, 2021.

TECHNICAL FIELD

The present invention relates to the optoelectronics field. It finds a particularly advantageous application in the manufacture of optoelectronic devices, for example light-emitting diodes based on GaN nanowires.

PRIOR ART

Typically, a GaN-based light-emitting diode (LED) comprises carrier (electrons or holes) injection regions between which an active region is interposed.

The active region is the location where radiative recombinations of electron-hole pairs occur, which allow obtaining a light emission. This active region is located at the PN junction. It comprises quantum wells, for example based on InGaN.

The carrier injection regions allow transporting and injecting an electric current at the active region. For some applications, in particular for display technologies, it is preferable to reduce the injection current in the LED. To preserve an effective operation and a sufficient radiative yield, it might be necessary to improve these carrier injection regions.

Typically, the hole injection region is based on p-GaN. During formation thereof, it initially comprises a concentration of impurities, for example magnesium Mg, neutralize by absorbed hydrogen. These “electrically-inactive” impurities must be activated to form acceptor sites. Thus, in order to have an effective p-type conductivity, an activation step applied to the hole injection region is necessary. Typically, this activation step is done by thermal annealing. During the annealing, the hydrogen neutralising the impurities is released and the impurities then form “active” acceptor sites. The concentration of these acceptor sites, called acceptor concentration, depends on the effectiveness of the activation step.

The document “Yuka Kuwano et al 2013 Jpn. J. Appl. Phys. 52 08JK1208JK12” discloses a method for improving the effectiveness of the step of activating a hole injection region buried under a N-type GaN layer. This method comprises the formation of channels within the stack of layers forming the carrier injection regions and the active region, before activation. In particular, this allows improving the release of hydrogen throughout the channels during the activation.

A drawback of this method is that the formation of the channels generates defects and/or interface states. This creates leakage currents whose carriers are not injected into the active region.

Another solution to improve the injection and/or transport of the current from the carrier injection regions towards the active region, consists in adding one or several carrier filtering layer(s) in the stack of the LED. Thus, the LED may comprise an Electron Blocking Layer, called EBL, between the hole injection region and the active region—so as to “filter” the carriers, and vice versa, a Hole Blocking Layer, called HBL, between the electron injection region and the active region. Nevertheless, these layers might alter the light emission.

The different regions and layers of the LED may be disposed by stacking according to a longitudinal direction z. Such a LED architecture is called axial. Alternatively, the different regions and layers of the LED may be disposed radially around the longitudinal direction z. Such a LED architecture is called radial or core-shell. Regardless of the targeted LED architecture, there is a need consisting in improving the hole injection.

The present invention aims to overcome at least partially the above-mentioned drawbacks.

In particular, an object of the present invention is to provide a light-emitting diode having an optimised hole injection region. Another object of the present invention is to provide a method for manufacturing such a light-emitting diode.

The other objects, features and advantages of the present invention will appear upon examining the following description and the appended drawings. Of course, other advantages may be incorporated. In particular, some features and some advantages of the method may apply mutatis mutandis to the device, and vice versa.

SUMMARY

To reach these above-mentioned objectives, a first aspect relates to a GaN-based light-emitting diode comprising:

- a n-GaN based electron injection region,
- a p-GaN based hole injection region,
- an active region located between the electron injection region and the hole injection region, configured to emit a light radiation.

Advantageously, the hole injection region comprises at least one activated portion and at least one inactivated portion such that the activated portion has an acceptor concentration at least ten times higher, and preferably at least one hundred times higher, than an acceptor concentration of the inactivated portion. The at least one inactivated portion is interposed between the electron injection region and a hydrogen blocking layer, configured to prevent a release of hydrogen from the inactivated portion during an activation step.

Thus, only one portion of the hole injection region—the activated portion—has an effective p-type conductivity. This promotes the injection of holes into the active region of the LED at the activated portion of the hole injection region. This limits or avoids the passage of current at the inactivated portion of the hole injection region.

A principle underlying the present invention consists in delimiting the most effective portions for carrier injection and/or recombination, by intentionally interposing a hydrogen blocking layer to avoid the activation of the least interesting portions for carrier injection and/or recombination. In particular, preference will advantageously be made to limit the injection of holes and the recombination of carriers to the regions of the LED having the least defects. This allows avoiding an energy efficiency loss due to the non-optimum regions of the LED—typically those that have the most defects—. Thus, these are intentionally kept inactivated.

The hydrogen blocking layer blocks the hydrogen diffusion. Thus, it is advantageous to dispose such a hydrogen blocking layer directly over a portion of the hole injection region, so that this portion is an inactivated portion. By selecting the location of the hydrogen blocking layer, it is thus possible to define which portion of the hole injection region is inactivated. In the case of a 3D LED based on nanowires for example, it is interesting that the inactivated portion is the lower portion of the nanowire(s) and that the activated portion is the upper portion of the nanowire(s). In general, the lower portion of the nanowire has a defect level higher than the upper portion. Henceforth, it has a higher leakage current. Thus, only the upper portion participates to the transport of the current. Thus, the transport of the current is optimised.

According to one example, the activated portion has an acceptor concentration higher than or equal to 1019 cm-3, and the at least one inactivated portion has an acceptor concentration lower than or equal to 1016 cm-3.

A second aspect relates to a method for manufacturing such a light-emitting diode.

According to one aspect, a method is described which comprises:

- A formation of a n-GaN based electron injection region,
- A formation of a p-GaN based hole injection region,
- A formation of an active region located between the electron injection region and the hole injection region, said active region being configured to emit a light radiation,
- A thermal activation configured to activate the hole injection region.

Advantageously, a hydrogen blocking layer is formed over only a portion of the hole injection region, before the activation, so that the activation is prevented at said portion of the hole injection region, called inactivated portion, and that the activation is effective over another portion of the hole injection region, called activated portion. The inactivated portion is interposed between the electron injection region and the hydrogen blocking layer.

Thus, the method advantageously allows avoiding the activation of a portion of the hole injection region. The hydrogen blocking layer formed over said portion before the thermal activation prevents a release of hydrogen from this portion during the activation. Thus, this portion is inactivated, whereas another portion of the hole injection region, not covered by the hydrogen blocking layer, is activated upon completion of the thermal activation.

For example, this method may be applied during the manufacture of a LED based on nanowires. The shell of the nanowire, generally intended to form a hole injection region, is covered over its lower portion by a hydrogen blocking layer before activation. Thus, this hydrogen blocking layer may be in the form of a ring over the lower portion of the nanowire. The lower portion, which is generally the portion having the highest defect level, is thus inactivated and does not participate to the transport and to the injection of the current towards and in the active region.

BRIEF DESCRIPTION OF THE FIGURES

The aims, objects, as well as the features and advantages of the invention will appear better from the detailed description of embodiments of the latter which are illustrated by the following appended drawings wherein.

Figure 1:
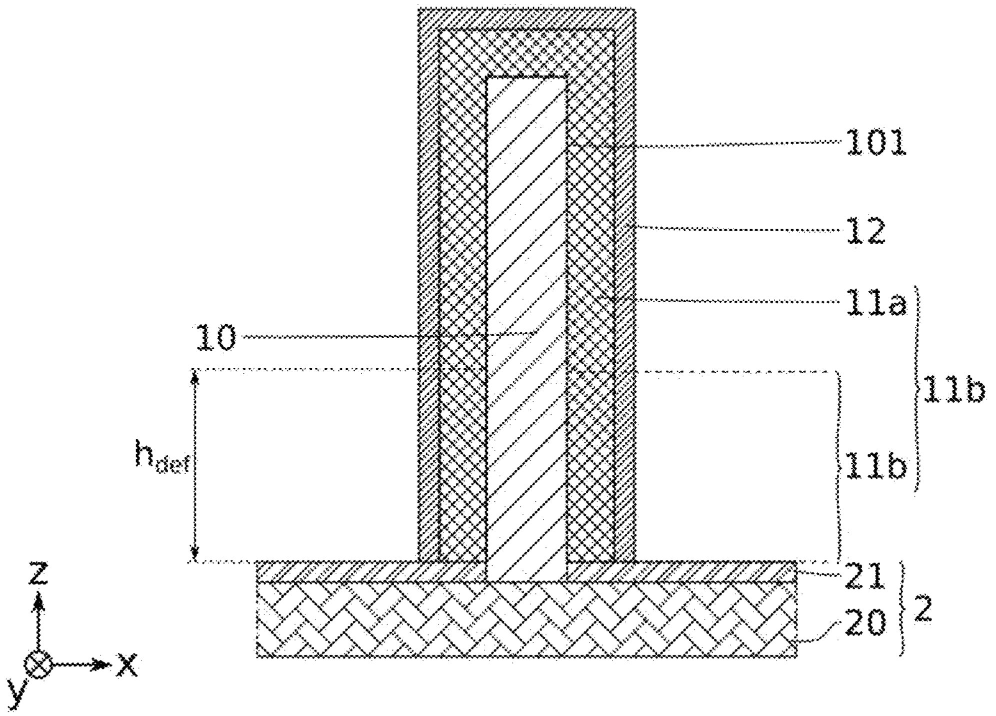
FIGS. 1 to 7 illustrate steps of a LED manufacturing method according to an embodiment of the present invention.

The drawings are provided as examples and do not limit the invention. They consist of schematic principle representations intended to facilitate understanding of the invention and are not necessarily to the scale of practical applications. In particular, the dimensions of the different portions of the LEDs are not necessarily representative of reality.

DETAILED DESCRIPTION

Before starting a detailed review of embodiments of the invention, it is reminded that the invention according to its first aspect comprises in particular the optional features hereinafter which could be used in combination or alternatively.

According to one example, the light-emitting diode comprises a so-called hydrogen reservoir layer interposed between the hydrogen blocking layer and the inactivated portion, said hydrogen reservoir layer being configured to provide a hydrogen supplement within the inactivated portion at least during the activation of the activated portion.

According to one example, the hydrogen blocking layer is based on silicon nitride having an initial hydrogen atom concentration comprised between 0.1% and 10%, and possibly up to 20%.

According to one example, for the hole injection region, the hydrogen blocking layer covers only the at least one inactivated portion.

According to one example, the hydrogen blocking layer is directly in contact with the at least one inactivated portion.

According to one example, the inactivated region has a defect level higher than the defect levels of the activated region. Typically, the defects are those that result in a drop of effectiveness in the transport and/or recombination of the carriers, for example crystalline defects.

According to one example, the activated portion has an acceptor concentration higher than or equal to 1018 cm-3, and preferably higher than or equal to 1019 cm-3.

According to one example, the at least one inactivated portion has an acceptor concentration lower than or equal to 1016 cm-3, and preferably lower than or equal to 1015 cm-3.

According to one example, the diode further comprises a passivation layer extending in contact with the hydrogen blocking layer.

According to one example, the active region s in the form of a PN junction between the hole and electron injection regions.

According to one example, the hydrogen blocking layer is based on at least one amongst AlN, n-GaN, n-AlGaN.

According to one example, the electron and hole injection regions extend along a basal plane, and the hydrogen blocking layer has at least one opening configured to expose the activated portion of the hole injection region.

According to one example, the electron injection region extends longitudinally in the form of a wire and the hole injection region extends radially around the electron injection region, so that the diode has a so-called core-shell architecture, and the hydrogen blocking layer extends radially in the form of a ring around the inactivated portion.

According to one example, the hydrogen blocking layer in the form of a ring is located at a base of the diode bearing on a substrate.

According to one example, the hydrogen blocking layer has a height h12 according to a longitudinal direction z comprised between 30% and 50% of a height hd of the diode considered according to the longitudinal direction z.

According to one example, the diode further comprises a hydrogen reservoir layer extending radially around the inactivated portion, between the inactivated portion and the hydrogen blocking layer.

According to one example, the diode further comprises a passivation layer extending radially around the hydrogen blocking layer.

According to its second aspect, the invention comprises in particular the optional features hereinafter which could be used in combination or alternatively:

According to one example, the method further comprises, before activation, a formation of a passivation layer over the hydrogen blocking layer.

According to one example, the method further comprises, before formation of the hydrogen blocking layer, a formation of a hydrogen reservoir layer over the inactivated portion, so that said hydrogen reservoir layer is interposed between the inactivated portion and the hydrogen blocking layer. According to one example, a portion of the hydrogen present in the hydrogen reservoir layer diffuses in the inactivated portion, preferably during the activation.

According to one example, the method further comprises a formation of a conductive transparent electrode over the activated portion of the hole injection region.

According to one example, the formation of the conductive transparent electrode comprises a thermal annealing, and the thermal activation is configured to replace said thermal annealing.

According to one example, the electron injection region is formed in the form of a wire from a substrate, according to a longitudinal direction z normal to a basal plane of the substrate, and the hole injection region is formed radially around the electron injection region, so that the diode has a so-called core-shell architecture.

According to one example, the hydrogen blocking layer is formed radially in the form of a ring around a portion of the hole injection region located at a base of the diode in contact with the substrate, so that the inactivated portion of the hole injection region is located at said base of the diode.

According to one example, the formation in the form of a ring of the hydrogen blocking layer comprises the following sub-steps:

- a conformal deposition of the hydrogen blocking layer over the core-shell diode,
- a conformal deposition of a passivation layer over the hydrogen blocking layer,
- a centrifugal deposition of a masking material over a height h22 around the passivation layer,
- a partial removal of the passivation layer at an upper portion of the wire, by isotropic etching,
- a removal of the masking material,
- a partial removal of the hydrogen blocking layer at the upper portion of the wire, by isotropic etching.

Except in the case of incompatibility, technical features described in detail for a given embodiment could be combined with the technical features described in the context of other embodiments described as non-limiting examples, so as to form another embodiment which is not necessarily illustrated or described. Of course, the invention does not exclude such an embodiment.

In the present invention, the method is particularly dedicated to the manufacture of light-emitting diodes (LED), and in particular for LEDs with a 3D structure.

More generally, the invention could be implemented for different optoelectronic devices.

Hence, the invention could also be implemented in the context of laser or photovoltaic devices.

Typically, a 3D LED has an elongate inner portion (the core) according to z and bearing on a substrate, an active region surrounding the inner portion, and an outer portion (the shell) surrounding the active region. In general, the inner portion is intended for the electron injection and the outer portion for hole injection. The active region may be in the form of a pn junction. Alternatively, the active region may comprise quantum wells extending parallel to the longitudinal direction z. An electron blocking layer may be present between the outer portion and the active region. A hole blocking layer may be present between the inner portion and the active region.

In the present invention, a hydrogen blocking layer is used to prevent the activation of a portion of the hole injection region. Preferably, this hydrogen blocking layer has a band gap and crystalline properties that prevent or minimise the diffusion of hydrogen in the hole injection region. A material that is suited for this hydrogen blocking layer may be selected from among non-doped GaN or aluminium nitride (AlN) or an alloy of these two materials, or else an AlGaN-based alloy. Aluminium oxide Al2O3 or magnesium oxide MgO are also materials that are suited for this hydrogen blocking layer.

Unless explicitly stated otherwise, it is specified that, in the context of the present invention, the relative arrangement of a third layer interposed between a first layer and a second layer, does not necessarily mean that the layers are directly in contact with each other, but means that the third layer is either directly in contact with the first and second layers, or separated from these by at least one other layer or at least one other element.

Thus, the terms and locutions “bear” and “cover” or “overlay” do not necessarily mean “in contact with”. The steps of the method as claimed should be understood broadly and could possibly be carried out in several sub-steps.

The term “3D structure” should be understood in contrast with the so-called planar or 2D structures, which have two dimensions in one plane that are quite larger than the third dimension normal to the plane. Thus, the common 3D structures targeted in the 3D LED field may be in the form of a wire, a nanowire or a microwire. Such a 3D structure has an elongate shape according to the longitudinal direction. The longitudinal dimension of the wire, according to z in the figures, is larger, and preferably quite larger, than the transverse dimensions of the wire, in the plane xy in the figures. For example, the longitudinal dimension is at least five times, and preferably at least ten times, larger than the transverse dimensions. 3D structures may also be in the form of walls. In this case, only a transverse dimension of the wall is quite smaller than the other dimensions, for example at least five times, and preferably at least ten times, smaller than the other dimensions. 3D structures may also be in the form of pyramids. In the present patent application, the terms “light-emitting diode”, “LED” or simply “diode” are used as indifferently. A “LED” could also be understood as a “micro-LED”.

Next, the following abbreviations relating to a material M could be used:

- a-M refers to the material M in the amorphous form, according to the terminology commonly used in the microelectronics industry for the prefix a-.
- p-M refers to the material M in the polycrystalline form, according to the terminology commonly used in the microelectronics industry for the prefix p-.

Similarly, the following abbreviations relating to a material M could be used:

- i-M refers to the intrinsic or non-intentionally doped material M, according to the terminology commonly used in the microelectronics industry for the prefix i-.
- n-M refers to the N, N+ or N++ doped material M, according to the terminology commonly used in the microelectronics industry for the prefix n-.
- p-M refers to the P, P+ or P++ doped material M, according to the terminology commonly used in the microelectronics industry for the prefix p-.

An object of the present invention is to improve hole injection, at the P-doped region of the LED.

In the context of the present application, a material is "effectively" P-type doped if it has an acceptor concentration [A] higher than or equal to 1019 cm-3. Typically, the acceptors or acceptor sites correspond to non-neutral impurities, capable of accepting at least one electron (or "giving" a hole). Neutral impurities could become non-neutral or active through a so-called activation step. Thus, only the "activated" impurities participate to the P-type conduction.

An object of the present invention is to activate only a portion of the hole injection region. In particular, this selective activation allows promoting the passage of current in the only activated portion of the hole injection region. Advantageously, this activated portion corresponds to the portion of the hole injection region having the best crystalline quality.

By substrate, layer, device, "based on" a material M, it should be understood a substrate, a layer, a device comprising only this material M or this material M and possibly other materials, for example alloy elements, impurities or doping elements. Thus, the p-GaN based hole injection region typically comprises GaN and magnesium (Mg) impurities.

A reference frame, preferably orthonormal, comprises the axes x, y, z is represented in some appended figures. This reference frame is applicable by extension to the other appended figures.

In the present patent application, we will preferably talk about a thickness for a layer and about a height for a structure or a device. The thickness is considered according to a direction normal to the main plane of extension of the layer, and the height is considered perpendicularly to the basal plane xy of the substrate. Thus, a layer typically has a thickness according to z, when it extends primarily along a plane xy, and a LED has a height according to z. The relative terms "over", "under", "underlying" preferably refer to positions considered according to the direction z.

The dimensional values should be understood within the manufacturing and measurement tolerances.

The terms "substantially", "about", "in the range of" mean, when they relate to a value, "within 10%" of this value or, when they relate to an angular orientation, "within 10°" of this orientation. Thus, a direction substantially normal to a plane means a direction having an angle 90±10° with respect to the plane. A first embodiment of the method according to the invention is illustrated in FIGS. 1 to 8. This first embodiments aims to form a 3D LED with a core-shell architecture with an optimised hole injection region.

In this first embodiment, a 3D LED structure is first formed in the form of a wire from a substrate 2 (FIG. 1).

Typically, the substrate 2 herein comprises a nucleation layer 20 and a masking layer 21.

Preferably, the nucleation layer 20 is based on AlN. Alternatively, it may be based on other metal nitrides, for example n-GaN or AlGaN. This nucleation layer 20 may be any layer enabling the nucleation and the growth of GaN known to a person skilled in the art. It may be formed by epitaxy over a support (not illustrated) made of silicon, preferably by MOVPE (acronym of "Metal Organic Vapour Phase Epitaxy"). Advantageously, it has a thickness smaller than or equal to 200 nm, preferably smaller than or equal to 100 nm, for example in the range of 50 nm.

Preferably, the masking layer 21 is made of a dielectric material, for example of silicon nitride Si3N4. It may be deposited by CVD (acronym of "Chemical Vapour Deposition") over the nucleation layer 20. It partially masks the nucleation layer 20 and comprises openings 210 preferably circular exposing areas of the nucleation layer 20. Typically, these openings 210 have a dimension, for example a diameter or an average dimeter, comprised between 30 nm and 600 nm.

A n-GaN wire is grown through an opening 210 of the masking layer 21. The formation of this wire is done by epitaxy, preferably by MOVPE (acronym of "Metal Organic Vapour Phase Epitaxy"), in particular as defined in the publication WO2012136665.

Alternatively, the formation of this wire may be done by MBE (acronym of "Molecular Beam Epitaxy"), by HVPE (acronym of "Hydride Vapour Phase Epitaxy"), by CVD and MOCVD (acronym of "Metal Organic Chemical Vapour Deposition").

This n-GaN wire is intended to form the electron injection region 10 of the LED. In a known manner, the N doping of this region 10 may result from a growth, an implantation and/or an activation annealing. In particular, the N doping may be obtained directly during the growth, from a silicon or germanium source, for example by addition of silane or disilane or germane vapour. The growth conditions needed for the formation of such a n-GaN wire 10 are widely known.

Preferably, the wire 10 has a diameter $\phi$ larger than or equal to 30 nm and/or smaller than or equal to 600 nm. The wire 10 also has a height h10 preferably larger than or equal to 150 nm. Preferably, this n-GaN wire 10 has an aspect ratio h10/$\phi$ greater than 1, and preferably greater than 5.

The n-GaN wire 10 herein forms the core of the 3D LED with a core-shell architecture.

Afterwards, a shell 11 made of p-GaN may be formed over the core 10.

This p-GaN shell is intended to form the hole injection region 11 of the LED. Preferably, this region 11 s formed by MOVPE epitaxy. In particular, the inclusion of P-type doping elements may be obtained directly during the growth, from a magnesium source for example. The growth conditions needed for the formation of such a p-GaN shell 11 are widely known.

The shell 11 may be formed directly over the core 10, so as to form a pn junction. Thus, the active region 101 corresponds to this pn junction. Alternatively, the active region may comprise, in a known manner, a plurality of quantum wells (not illustrated) configured to emit a light radiation according to a main wavelength A. For example, these quantum wells are based on InGaN. Conventionally, they could be separated from each other by AlGaN-based barriers.

Typically, the shell 11 has an upper portion 11*a* and a lower portion 11*b*. Typically, the lower portion 11*b* bears on the substrate 2 and has a height hdef. In general, this lower portion 11*b* has a defect level higher than that of the upper portion 11*a*.

Upon completion of the growth, the P doping of the region 11 is still not effective. Indeed, an activation step, typically a thermal annealing in a nitrogen N2 atmosphere, is necessary to activate the doping elements present in the region 11. This step aims to eliminate hydrogen absorbed within the region 11 and neutralising the doping elements.

Advantageously, this activation step is not carried out at this level, so that the shell 11 is not activated and does not have an effective P-type conductivity. In contrast, the shell 11 may be subjected to a hydrogen atmosphere so as to passivate or inactivate the p-GaN.

As illustrated in FIG. 1, a hydrogen blocking layer type layer 12 may be deposited in a conformal manner over the inactivated p-GaN based shell 11. The hydrogen blocking layer 12 may be based on n-GaN, I—AlN, n-AlGaN or on a combination of these materials. In particular, the layer 12 may comprise a stack of layers, for example an I—AlN layer associated to a n-GaN layer, or an n-AlGaN layer associated to an I—AlN layer. Preferably, the hydrogen blocking layer 12 has a thickness comprised between 5 nm and 100 n, typically in the range of 10 nm.

The hydrogen blocking layer 12 is based on a material preferably having a band gap and crystalline properties that prevent or minimise the diffusion of hydrogen in the hole injection region. Preferably, the hydrogen blocking layer 12 is based on a material that could advantageously be deposited by epitaxy and which is compatible with the materials of the active and hole injection regions. In particular, such a material has a low mesh parameter mismatch with the materials of the active and hole injection regions. The layer 12 is also referred to as HyBL, meaning "Hydrogen Blocking Layer". Thus, the presence of this HyBL layer 12 over the region 11 could prevent the activation of this region 11. One principle of the invention consists in preserving a portion of this HyBL layer 12 over a portion of lesser interest of the region 11, typically the lower portion 11*b* of the region 11, so as to inactivate it.

Figure 2:
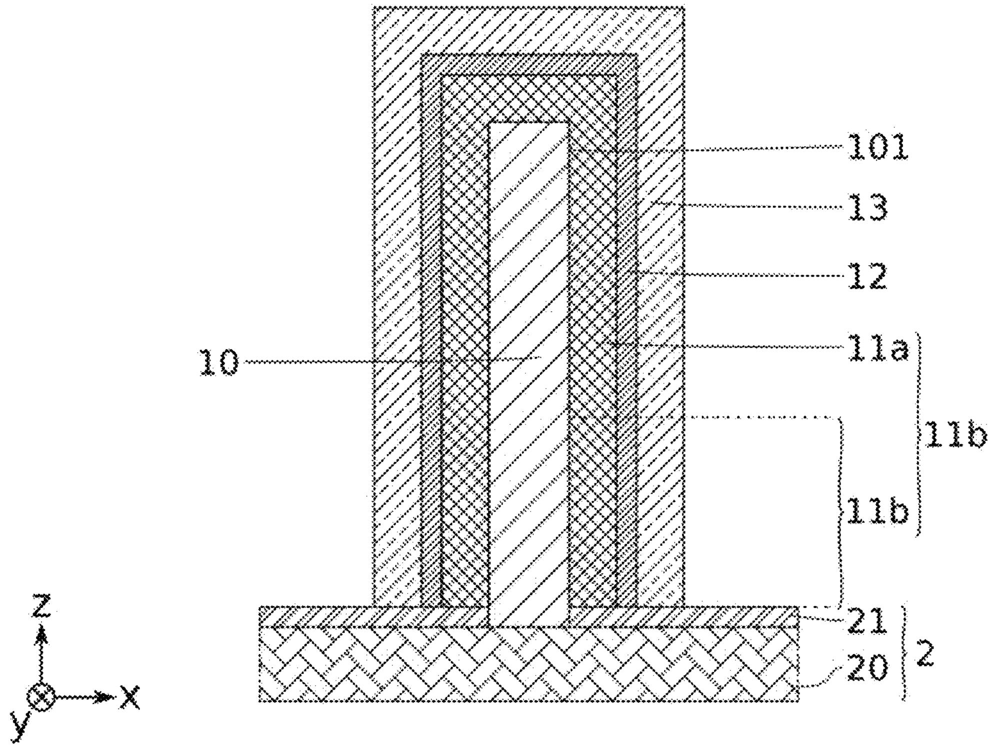

As illustrated in FIG. 2, a passivation layer 13 may be deposited in a conformal manner over the HyBL layer 12. Typically, this passivation layer 13 is based on a dielectric material, for example based on silicon nitride or silicon oxide.

Figure 3:
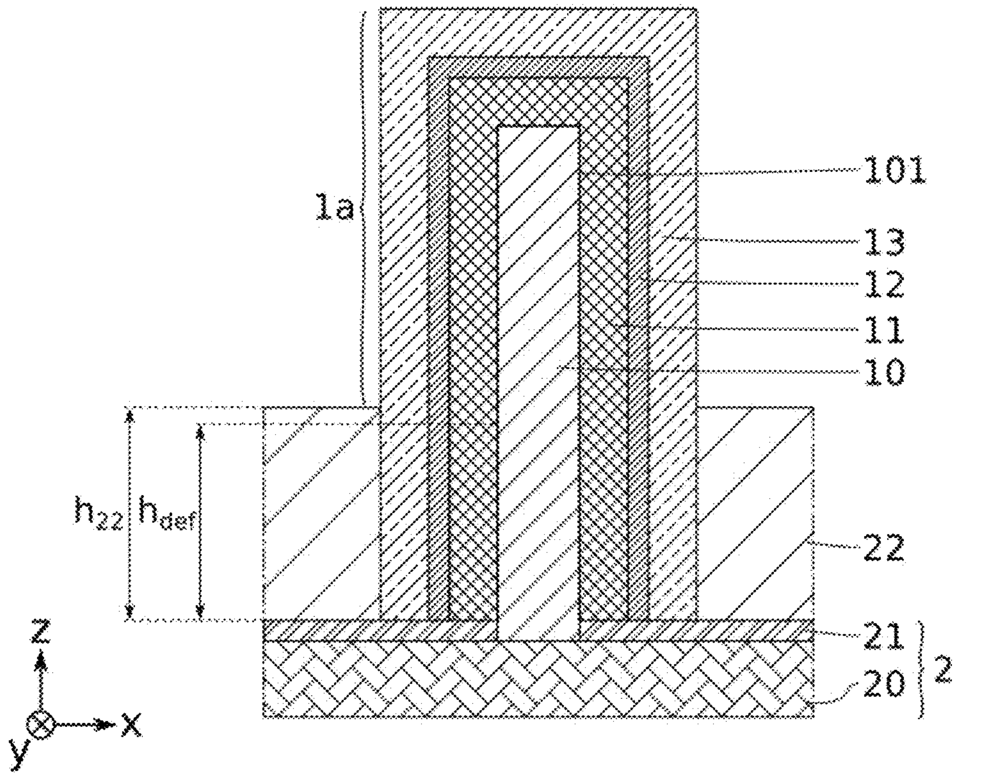

As illustrated in FIG. 3, a masking material 22 may be deposited by centrifugation over a height h22 around the passivation layer 13. Preferably, the centrifugation conditions are selected such that h22≥hdef. This allows masking the base of the LED over the entire height of the lower portion 11*b* of the region 11. Thus, only an upper portion 1*a* of the LED is not covered by the masking material 22. Preferably, this upper portion 1*a* substantially corresponds to the upper portion 11*a* of the region 11 which has the least defects.

Figure 4:
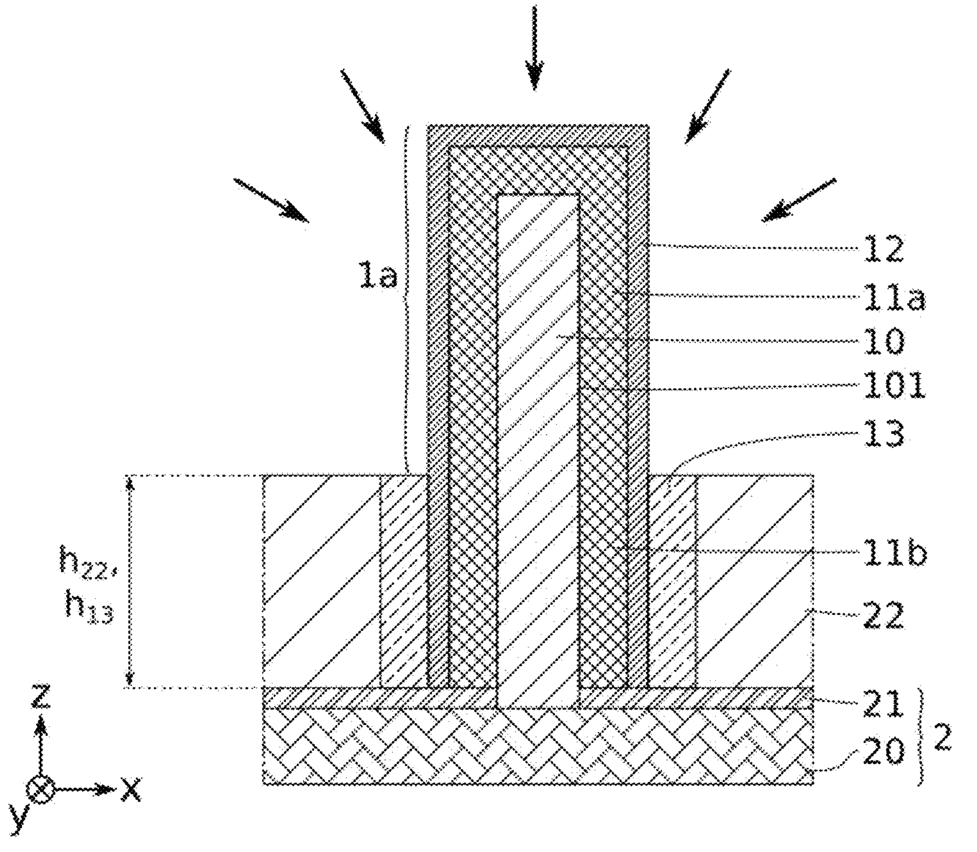

As illustrated in FIG. 4, a partial removal of the passivation layer 13 is then performed at the upper portion 1*a* of the LED. This partial removal may be performed in a known manner by isotropic etching of the material of the layer 13. Upon completion of this removal, only an upper portion 1*a* of the LED is not covered by the passivation layer 13. The portion of the layer 13 covered by the masking material 22 is preserved in the form of a ring or collar, at the base of the LED. Typically, the collar 13 has a height h13 substantially equal to the height h22 of the masking material 22.

Figure 5:
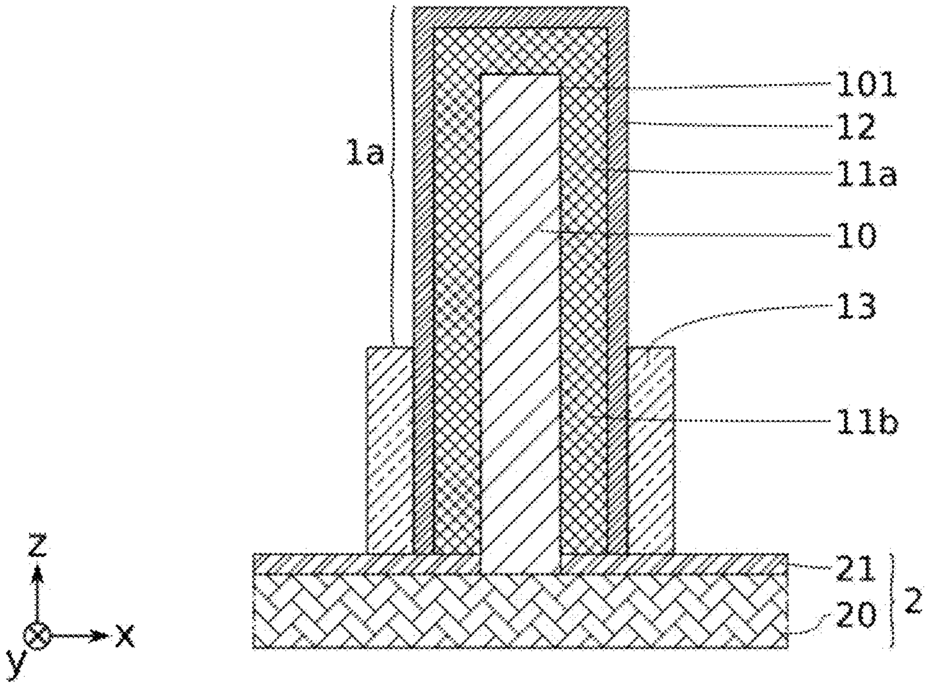

As illustrated in FIG. 5, the masking material 22 may be removed afterwards. At this level, the collar 13 surrounds the HyBL layer 12 at the base of the LED. The HyBL layer 12 is exposed at the upper portion 1*a* of the LED.

Figure 6:
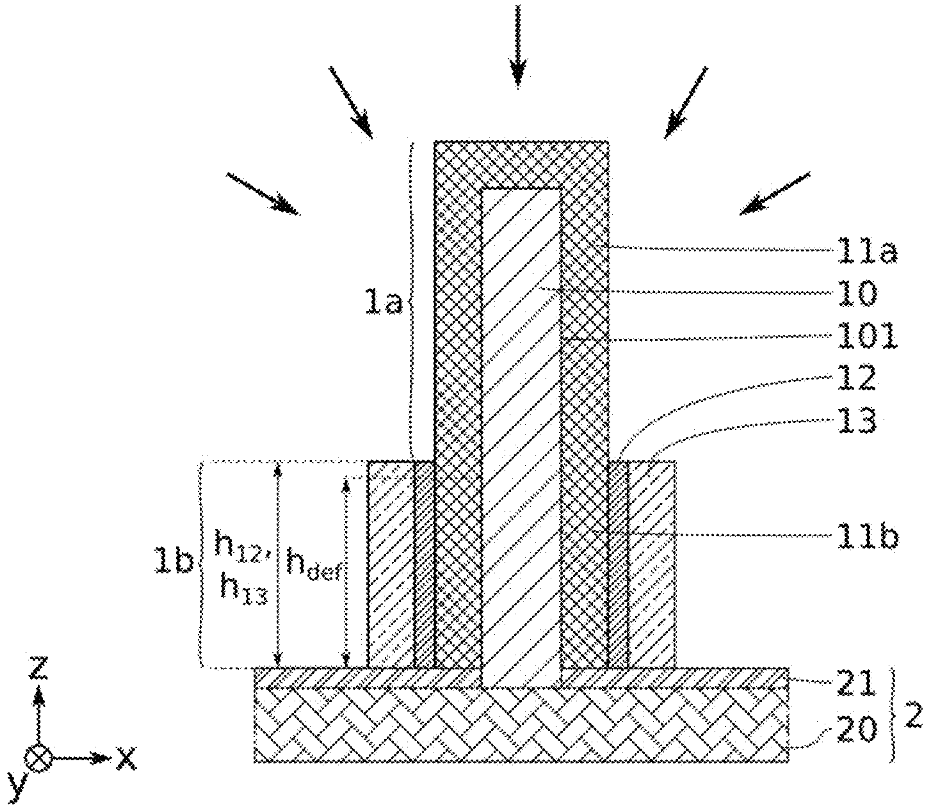

As illustrated in FIG. 6, the HyBL layer 12 is then partially removed at the upper portion 1*a* of the LED. This partial removal may be performed in a known manner by isotropic etching of the material of the layer 12 selectively with regards to the material of the layer 13. The isotropic etching may be done by wet etching, for example using a TMAH (tetramethylammonium hydroxide) solution. Advantageously, a portion of the HyBL layer 12 is preserved after this partial removal, in the form of a ring or a collar, between the collar 13 and the lower portion 11*b* of the region 11, at the base of the LED. Typically, this portion of the HyBL layer 12 has a height h12 substantially equal to the height h13 of the collar 13. The height h12 according to z may be comprised between 30% and 50% of the height hd of the diode. The height h12 of the HBL layer 12 may be adjusted according to the nominal operating current for the diode. Upon completion of this removal, only the upper portion 1*a* of the LED is not covered by the HyBL layer 12. Thus, the upper portion 11*a* of the region 11 is exposed.

Figure 7:
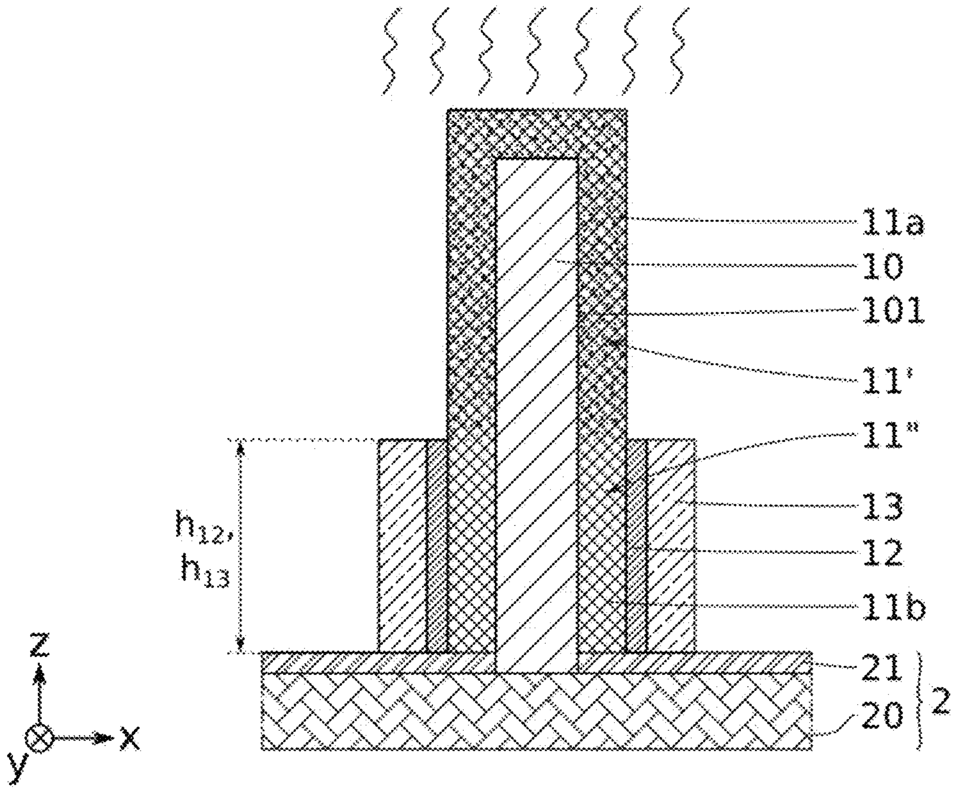

According to an embodiment illustrated in FIG. 7, the activation step allowing making doping of the region 11 effective is performed after partial removal of the HyBL layer 12 and before formation of the transparent conductive electrode. Typically, this activation step is done by thermal annealing in a hydrogen-free neutral or oxidising atmosphere, for example in nitrogen or in a mixture of oxygen and nitrogen. Preferably, the annealing temperature is higher than 500° C., for example in the range of 650° C., when the atmosphere is oxidising. Preferably, the annealing temperature is higher than 700° C., for example in the range of 750° C., when the atmosphere is neutral.

This activation step allows activating the p-GaN based region 11 locally by hydrogen release. Thus, an activated portion 11' is formed at the upper portion 1*a* of the LED. This activated portion 11' substantially corresponds to the upper portion 11*a* of the region 11 which has the least defects. Thus, such an activated portion 11' may have an acceptor concentration higher than or equal to 1018 cm-3, and preferably higher than or equal to 1019 cm-3.

Thanks to the presence of the HyBL layer 12, an inactivated portion 11" is also formed upon completion of the activation step. This inactivated portion 11" substantially corresponds to the lower portion 11*b* of the region 11 which has the least defects. Thus, such an inactivated portion may have an acceptor concentration lower than or equal to 1016 cm-3, and preferably lower than or equal to 1015 cm-3. Typically, the inactivated portion 11" is interposed between the electron injection region 10 and the HyBL layer 12.

Figure 8:
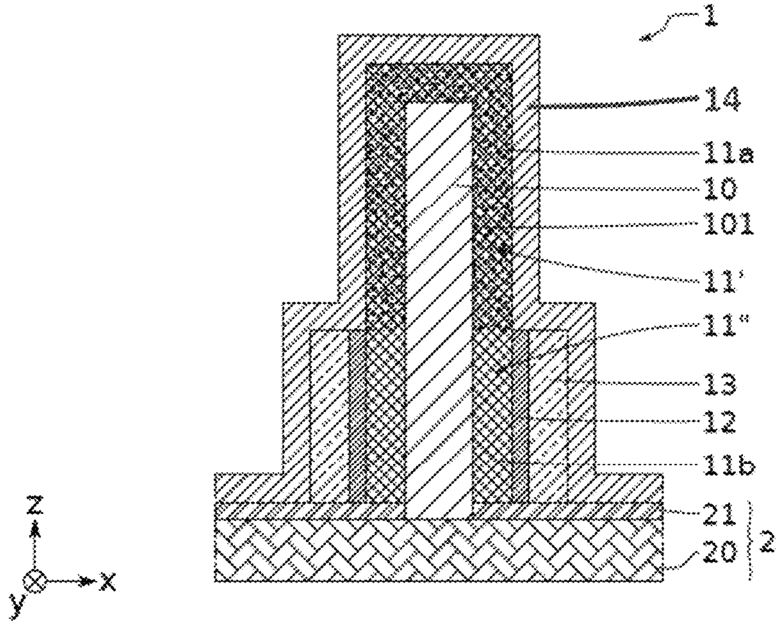
FIG. 8 illustrates a 3D LED, according to a first embodiment of the present invention.

According to an embodiment illustrated in FIG. 8, a transparent conductive electrode 14, generally called TCO (acronym of "Transparent Conductive Oxide"), is formed over the activated portion 11' after activation. The passivation layer 13 allows electrically insulating the HyBL layer 12 from the TCO electrode 14.

In a known manner, the TCO electrode 14 needs a thermal annealing, typically an annealing in an oxidising atmosphere, during formation thereof.

According to an embodiment that is not illustrated, the TCO electrode is formed over the region 11 before the activation step. A thermal annealing in an oxidising atmosphere at a temperature in the range of 650° C. then advantageously allows completing the formation of the TCO electrode while simultaneously carrying out the activation step allowing obtaining the activated portion 11' of the region 11. The TCO electrode does not form a barrier to hydrogen diffusion. Thus, the activation step and the annealing of the TCO could be carried out simultaneously in one single step. This allows gaining one step of the process.

In any event, the intentional use of the HyBL layer 12 allows forming an inactivated portion 11" locally. The inactivated portion 11" is selected so as to optimise the operation of the LED. According to the embodiment illustrated in FIG. 8, this inactivated portion 11" advantageously corresponds to the lower portion 11*b* of a hole injection region 11 of a 3D LED with a core-shell architecture.

Figure 9:
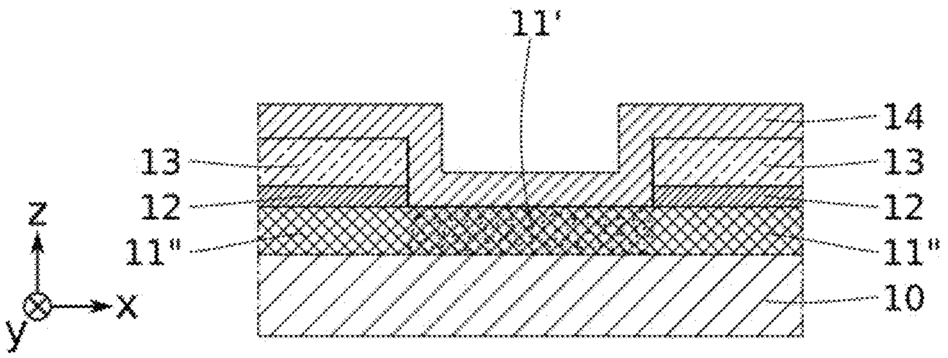
FIG. 9 illustrates a 2D LED, according to a second embodiment of the present invention.

According to another embodiment illustrated in FIG. 9, the LED may have a so-called planar 2D architecture. In this case, a hole injection layer 11 is formed by stacking according to z over an electron injection layer 10. Afterwards, the HyBL layer 12 is formed by stacking according to z over the hole injection layer 11. Preferably, the passivation layer 13 is formed by stacking according to z over the HyBL layer 12. Afterwards, an opening is formed, for example by lithography/etching, throughout the layers 13 and 12, so as to expose a portion of the hole injection layer 11. Afterwards, the TCO electrode 14 is formed in the opening over the exposed portion of the layer 11, before or after the activation step. Thus, a planar 2D LED comprising an activated portion 11' and at least one inactivated portion 11" is formed. Advantageously, the activated portion may be located at the centre of the 2D LED whereas the inactivated portion 11" may be located at the periphery of the 2D LED.

Figure 10:
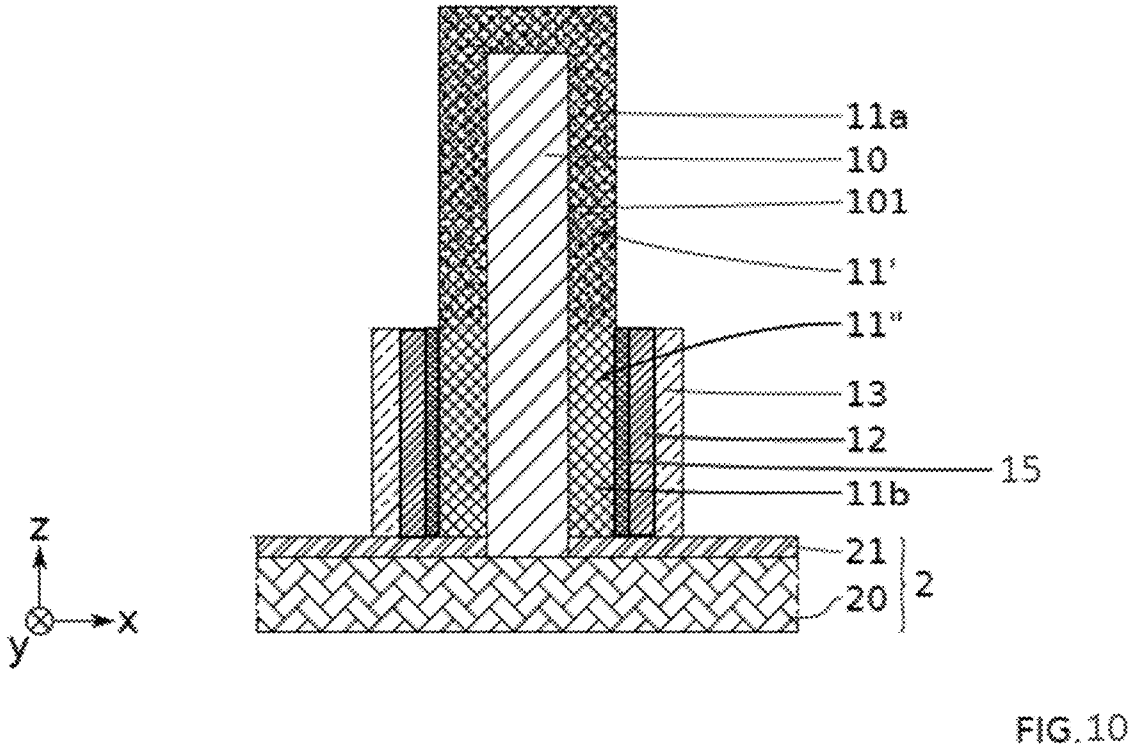
FIG. 10 illustrates a 3D LED, according to a third embodiment of the present invention.

According to another embodiment illustrated in FIG. 10, a so-called hydrogen reservoir layer 15 may be interposed between the lower portion 11*b* of the region 11 and the HyBL layer 12. Advantageously, this hydrogen reservoir layer 15 is configured to contain an initial amount of hydrogen before the step of activating the upper portion 11*a* of the region 11, and to release at least part of this initially contained hydrogen in the direction of the lower portion 11*b* of the region 11, preferably during the activation step. Thus, typically, an exodiffusion of the hydrogen occurs from the hydrogen reservoir layer 15 towards the lower portion 11*b* of the region 11, mostly during the activation step. This allows enriching the lower portion 11*b* of the region 11 with hydrogen, which inactivates the doping elements of this lower portion 11*b*. The hydrogen reservoir layer 15 allows injecting hydrogen within the lower portion 11*b* by diffusion. Thus, the inactivation effect of the lower portion 11*b* obtained in the other embodiments thanks to the presence of the HyBL layer 12, is herein increased or amplified by the presence of this hydrogen reservoir layer 15 providing directly a hydrogen supplement within the lower portion 11*b*.

The amount of hydrogen to be diffused from the hydrogen reservoir layer 15 towards the lower portion 11*b* is not necessarily high. Traces might be enough to inactivate the lower portion 11*b*.

Preferably, the hydrogen reservoir layer 15 will be selected made of a material having an initial amount of hydrogen from a few percent to a few ten percent and allowing releasing this hydrogen into the material of the lower portion 11*b*, in particular during the activation. The silicon nitride, in particular when deposited by PECVD (acronym of "Plasma Enhanced Chemical Vapour Deposition"), typically contains a hydrogen atom concentration of 0.1% to 10%, and possibly up to 20%. Thus, the silicon nitride forms a source of hydrogen which is suited for the hydrogen reservoir layer 15. The fragility of the Si—H and N—H bonds, and the mobility of hydrogen in this material allow for a good exodiffusion of hydrogen towards the semiconductor material of the lower portion 11*b*. Other materials may also be suited for the hydrogen reservoir layer 15, in particular nitrided materials such as SiN, $Si_3N_4$, SiCN.

Preferably, the hydrogen reservoir layer 15 has a thickness comprised between 2 nm and 20 nm, typically in the range of 5 nm.

Typically, this hydrogen reservoir layer 15 may be formed by PECVD conformal deposition over the region 11 before deposition of the HyBL layer 12 and of the passivation layer 13. A partial removal at the upper portion 1*a* of the LED may be performed in a known manner by isotropic etching of the material of the layer 15 selectively with regards to the other constituent materials of the LED. The isotropic etching may be done by wet etching or dry etching, for example using a fluorinated or fluorocarbonated plasma. Advantageously, a portion of the layer 15 is preserved after this partial removal, in the form of a ring or collar, between the lower portion 11*b* of the region 11 and the HyBL layer 12, at the base of the LED. Typically, this portion of the layer 15 has a height substantially equal to the height of the collar 13. Upon completion of this removal, only the upper portion 1*a* of the LED s not covered by the layer 15. This embodiment illustrated in FIG. 10 produces an additional effect for the inactivation of the lower portion 11*b*, thanks to the hydrogen reservoir layer 15. Of course, this embodiment could be adapted to a 2D planar architecture as illustrated in FIG. 9, by providing for a hydrogen reservoir layer 15 interposed between the HyBL layer 12 and the inactivated portion 11".

The invention is not limited to the previously-described embodiments and encompasses all of the embodiments covered by the claims.

In particular, the dimensions of the HyBL layer may be adjusted so as to limit the activated portion to a given operating current, and/or to an area of interest of the LED.

The invention claimed is:

1. A GaN-based light-emitting diode comprising:

a n-GaN based electron injection region, a p-GaN based hole injection region, an active region located between the electron injection region and the hole injection region, configured to emit a light radiation, wherein the hole injection region comprises at least one activated portion and at least one inactivated portion such that the activated portion has an acceptor concentration at least ten times greater than an acceptor concentration of the inactivated portion, and said at least one inactivated portion is interposed between the electron injection region and a hydrogen blocking layer configured to prevent a release of hydrogen from the inactivated portion during an activation of the activated portion.

2. The light-emitting diode according to claim 1, wherein the hydrogen blocking layer covers, for the hole injection region, only the at least one inactivated portion.

3. The light-emitting diode according to claim 1, comprising a hydrogen reservoir layer interposed between the hydrogen blocking layer and the inactivated portion, said hydrogen reservoir layer being configured to provide a hydrogen supplement within the inactivated portion at least during the activation of the activated portion.

4. The light-emitting diode according to claim 3, wherein the hydrogen reservoir layer is based on silicon nitride having a hydrogen atom concentration comprised between 0.1 and 20%.

5. The light-emitting diode according to claim 1, wherein the hydrogen blocking layer is directly in contact with the at least one inactivated portion.

6. The light-emitting diode according to claim 1, wherein the inactivated portion has a defect level greater than the defect level of the activated portion.

7. The light-emitting diode according to claim 1, further comprising a passivation layer extending in contact with the hydrogen blocking layer.

8. The light-emitting diode according to claim 1, wherein the active region lies within a PN junction between the hole and electron injection regions.

9. The light-emitting diode according to claim 1, wherein the hydrogen blocking layer is based on at least one amongst AlN, n-GaN, n-AlGaN.

10. The light-emitting diode according to claim 1, wherein the electron and hole injection regions extend along a basal plane, and wherein the hydrogen blocking layer has at least one opening configured to expose the activated portion of the hole injection region.

11. The light-emitting diode according to claim 1, wherein the electron injection region extends longitudinally in the form of a wire according to a longitudinal direction and the hole injection region extends radially around the electron injection region, so that the diode has a core-shell architecture, and wherein the hydrogen blocking layer extends radially in the form of a ring around the inactivated portion.

12. The light-emitting diode according to claim 11, wherein the hydrogen blocking layer in the form of a ring is located at a base of the diode bearing on a substrate.

13. The light-emitting diode according to claim 11, wherein the hydrogen blocking layer has a height $h_{12}$ according to the longitudinal direction comprised between 30% and 50% of a height $h_d$ of the diode considered according to the longitudinal direction.

14. The light-emitting diode according to claim 11, further comprising a hydrogen reservoir layer extending radially around the inactivated portion, between the inactivated portion and the hydrogen blocking layer.

15. The light-emitting diode according to claim 11, further comprising a passivation layer extending radially around the hydrogen blocking layer.

16. A method for manufacturing a GaN-based light-emitting diode comprising at least the following steps:

a formation of a n-GaN based electron injection region, a formation of a p-GaN based hole injection region, a formation of an active region located between the electron injection region and the hole injection region, said active region being configured to emit a light radiation, and a thermal activation configured to activate the hole injection region, wherein a hydrogen blocking layer is formed before the activation and over only a portion of the hole injection region, so that the activation is prevented at said portion of the hole injection region, called inactivated portion, and that the activation is effective over another portion of the hole injection region, called activated portion, and that said inactivated portion is interposed between the electron injection region and the hydrogen blocking layer, and wherein the thermal activation is configured such that the activated portion has an acceptor concentration at least ten times greater than the acceptor concentration of the inactivated portion.

17. The method according to claim 16, further comprising, before formation of the hydrogen blocking layer, a formation of a hydrogen reservoir layer over the inactivated portion, so that said hydrogen reservoir layer is interposed between the inactivated portion and the hydrogen blocking layer.

18. The method according to claim 16, further comprising, before activation, a formation of a passivation layer over the hydrogen blocking layer.

19. The method according to claim 16, further comprising, a formation of a conductive transparent electrode over the activated portion of the hole injection region.

20. The method according to claim 19, wherein the formation of the conductive transparent electrode comprises a thermal annealing, and wherein the thermal activation is configured to replace said thermal annealing.

21. The method according to claim 16, wherein the electron injection region is formed in the form of a wire from a substrate, according to a longitudinal direction normal to a basal plane of the substrate, and wherein the hole injection region is formed radially around the electron injection region, so that the diode has a core-shell architecture, and wherein the hydrogen blocking layer is formed radially in the form of a ring around a portion of the hole injection region located at a base of the diode in contact with the substrate, so that the inactivated portion of the hole injection region is located at said base of the diode.

22. The method according to claim 21, wherein the formation in the form of a ring of the hydrogen blocking layer comprises the following sub-steps:

a conformal deposition of the hydrogen blocking layer over the core-shell diode, a conformal deposition of a passivation layer over the hydrogen blocking layer, a centrifugal deposition of a masking material over a height $h_{22}$ around the passivation layer, a partial removal of the passivation layer at an upper portion of the wire, by isotropic etching, a removal of the masking material, and a partial removal of the hydrogen blocking layer at the upper portion of the wire, by isotropic etching.

* * * * *